US012588204B2

(12) United States Patent
Yang et al.

(10) Patent No.: US 12,588,204 B2
(45) Date of Patent: Mar. 24, 2026

(54) METHOD OF MANUFACTURING SEMICONDUCTOR DEVICE INCLUDING SILICON CHANNEL HAVING INCREASED MOBILITY

(71) Applicant: Samsung Electronics Co., Ltd., Suwon-si (KR)

(72) Inventors: Siyeong Yang, Suwon-si (KR); Yuyeon Kim, Suwon-si (KR); Minjun Oh, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 537 days.

(21) Appl. No.: 18/166,237

(22) Filed: Feb. 8, 2023

(65) Prior Publication Data

US 2023/0269943 A1     Aug. 24, 2023

(30) Foreign Application Priority Data

Feb. 21, 2022    (KR) ........................ 10-2022-0022454

(51) Int. Cl.
*H10B 43/27*          (2023.01)
*H10B 41/27*          (2023.01)
(52) U.S. Cl.
CPC ............. *H10B 43/27* (2023.02); *H10B 41/27* (2023.02)
(58) Field of Classification Search
CPC ................................ H10B 43/27; H10B 41/27
See application file for complete search history.

(56) References Cited

U.S. PATENT DOCUMENTS

| | | | |
|---|---|---|---|
| 7,141,116 B2 | 11/2006 | Son et al. | |
| 7,795,123 B2 | 9/2010 | Park et al. | |
| 8,394,726 B2 | 3/2013 | Maeda et al. | |
| 9,443,866 B1 * | 9/2016 | Sakakibara ............ | H10B 43/10 |
| 9,536,894 B2 | 1/2017 | Tajima et al. | |

(Continued)

FOREIGN PATENT DOCUMENTS

| | | |
|---|---|---|
| JP | 2006-120734 A | 5/2006 |
| KR | 10-2010-0074679 A | 7/2010 |
| KR | 10-2015-0083319 A | 7/2015 |

OTHER PUBLICATIONS

Office Action in Korean Appln. No. 10-2022-0022454, mailed on Sep. 16, 2025, 11 pages (with English translation).

*Primary Examiner* — Eliseo Ramos Feliciano
*Assistant Examiner* — Timothy Edward Duren
(74) *Attorney, Agent, or Firm* — Fish & Richardson P.C.

(57)          ABSTRACT

A method of manufacturing a semiconductor device includes forming a stacked structure in which a plurality of interlayer insulating layers and a plurality of sacrificial layers are alternately stacked on a substrate, etching the stacked structure to form an opening exposing a part of the substrate through the stacked structure, forming a channel layer on a part of the substrate. The forming of the channel layer includes forming a first amorphous silicon layer at a first temperature on the part of the substrate by supplying a silicon source gas and an impurity source gas together and forming a second amorphous silicon layer at a second temperature on the first amorphous silicon layer by supplying the silicon source gas and not supplying the impurity source gas after the forming of the first amorphous silicon layer, and the second temperature is higher than the first temperature.

19 Claims, 15 Drawing Sheets

(56) References Cited

U.S. PATENT DOCUMENTS

| | | | | |
|---|---|---|---|---|
| 9,540,743 | B2 | 1/2017 | Takahashi et al. | |
| 9,941,119 | B2 | 4/2018 | Moriya et al. | |
| 2011/0275197 | A1 | 11/2011 | Park et al. | |
| 2015/0194440 | A1* | 7/2015 | Noh | H10D 30/693 |
| | | | | 257/324 |
| 2015/0372005 | A1* | 12/2015 | Yon | H10B 43/27 |
| | | | | 257/314 |
| 2017/0110464 | A1* | 4/2017 | Rabkin | H10B 43/35 |
| 2018/0033646 | A1* | 2/2018 | Sharangpani | H10B 12/00 |
| 2020/0051994 | A1 | 2/2020 | Purayath et al. | |
| 2021/0013225 | A1 | 1/2021 | Saito et al. | |

* cited by examiner

METHOD OF MANUFACTURING SEMICONDUCTOR DEVICE INCLUDING SILICON CHANNEL HAVING INCREASED MOBILITY

CROSS-REFERENCE TO RELATED APPLICATION

This application is based on and claims priority under 35 U.S.C. § 119 to Korean Patent Application No. 10-2022-0022454, filed on Feb. 21, 2022, in the Korean Intellectual Property Office, the disclosure of which is incorporated by reference herein in its entirety.

BACKGROUND

The inventive concepts relate to a method of manufacturing a semiconductor device, and more particularly, to a method of manufacturing a semiconductor device including a silicon channel.

In an electronic system requiring data storage, a semiconductor device capable of storing higher-capacity data in a smaller area may be advantageous. Accordingly, a method of increasing capacity (that is, a degree of integration) of data that may be stored in a unit area of the semiconductor device is being studied. For example, a three-dimensional (3D) memory semiconductor device with 3D memory cells instead of two-dimensional (2D) memory cells has been proposed.

In the 3D memory semiconductor device, a larger amount of data may be stored in the same area by increasing the number of memory cells stacked in a vertical direction. However, in order to increase the number of memory cells stacked in the vertical direction, a channel length in the vertical direction may be increased, and thus a cell current may be excessively reduced.

SUMMARY

The inventive concepts relate to a method of manufacturing a semiconductor device including a silicon channel having increased mobility.

According to an aspect of the inventive concepts, there is provided a method of manufacturing a semiconductor device, including forming a stacked structure in which a plurality of interlayer insulating layers and a plurality of sacrificial layers are alternately stacked on a substrate, etching the stacked structure to form an opening exposing a part of the substrate through the stacked structure, forming a channel layer on a part of the substrate and a side surface of the opening, and replacing the plurality of sacrificial layers by a plurality of gate layers. The forming of the channel layer includes forming a first amorphous silicon layer at a first temperature on the part of the substrate and the side surface of the opening by supplying a silicon source gas and an impurity source gas together and forming a second amorphous silicon layer at a second temperature on the first amorphous silicon layer by supplying the silicon source gas and not supplying the impurity source gas after the forming of the first amorphous silicon layer, and the second temperature is higher than the first temperature.

According to an aspect of the inventive concepts, there is provided a method of manufacturing a semiconductor device, the method comprising: forming a stacked structure in which a plurality of interlayer insulating layers and a plurality of sacrificial layers are alternately stacked on a substrate; etching the stacked structure to form an opening passing through the stacked structure; forming a first amorphous channel layer including impurities on a side surface of the opening; and forming a second amorphous channel layer on the first amorphous channel layer.

According to an aspect of the inventive concepts, there is provided a method of manufacturing a semiconductor device, the method comprising: forming a stacked structure in which a plurality of interlayer insulating layers and a plurality of sacrificial layers are alternately stacked on a substrate; etching the stacked structure to form an opening exposing a part of the substrate through the stacked structure; forming a gate insulating layer on a side surface of the opening; forming a first amorphous silicon layer at a first temperature on a part of the substrate and the gate insulating layer by supplying a silicon source gas and an impurity source gas together; forming a second amorphous silicon layer on the first amorphous silicon layer at a second temperature higher than the first temperature by supplying a silicon source gas and not supplying the impurity source gas; and forming a polycrystalline silicon layer by crystallizing the first amorphous silicon layer and the second amorphous silicon layer, wherein the impurities comprises at least one selected from the group consisting of O, C, and N.

BRIEF DESCRIPTION OF THE DRAWINGS

Example embodiments will be more clearly understood from the following detailed description taken in conjunction with the accompanying drawings in which:

FIG. 1F is an enlarged view of a region P of FIG. 1E;

FIG. 1H is an enlarged view of a region Q of FIG. 1G;

FIG. 1J is a cross-sectional view of a semiconductor device according to example embodiments;

DETAILED DESCRIPTION OF EXAMPLE EMBODIMENTS

Figure 1A:
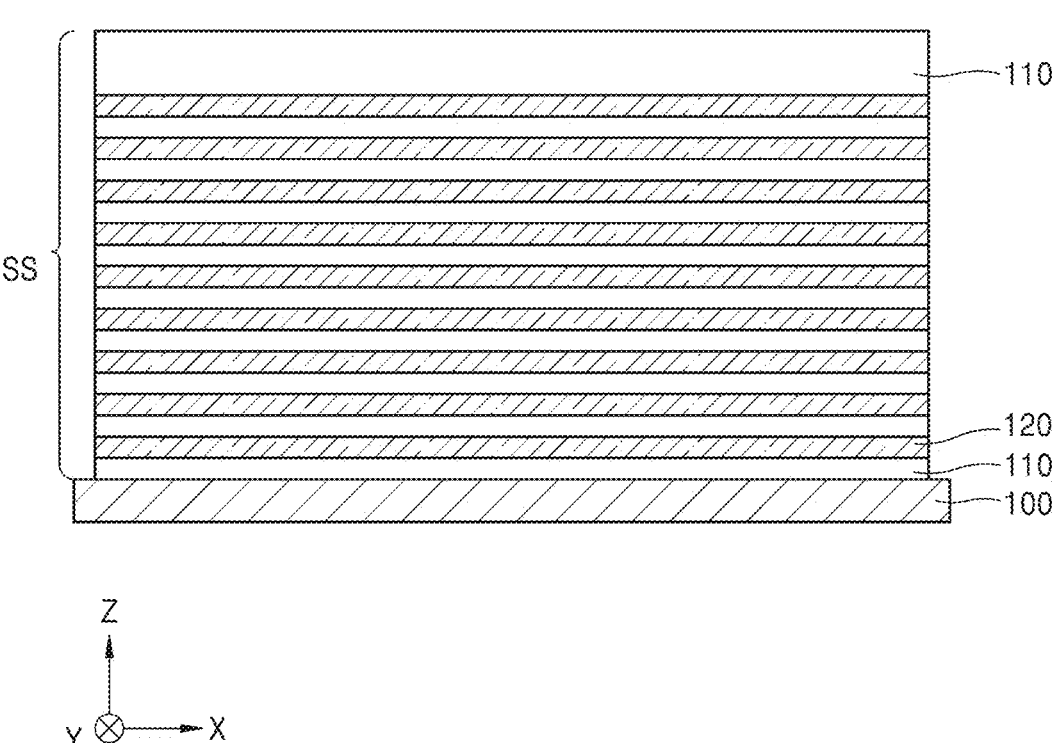
FIGS. 1A to 1J are cross-sectional views illustrating a method of manufacturing a semiconductor device according to example embodiments.
Figure 1B:
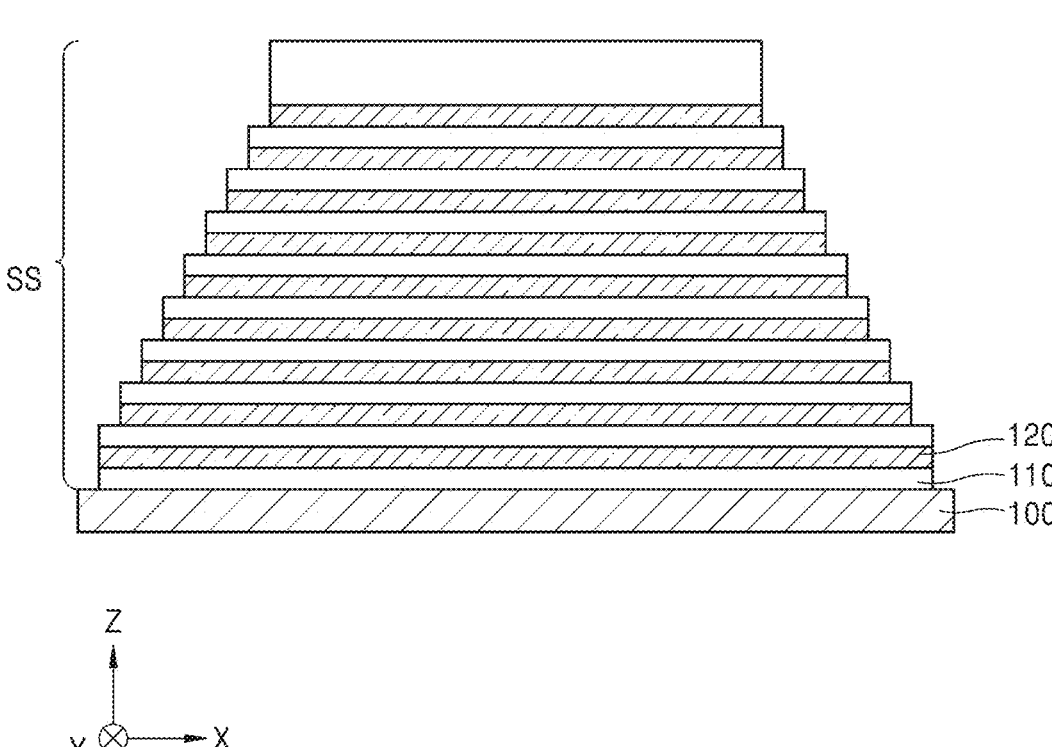
Figure 1C:
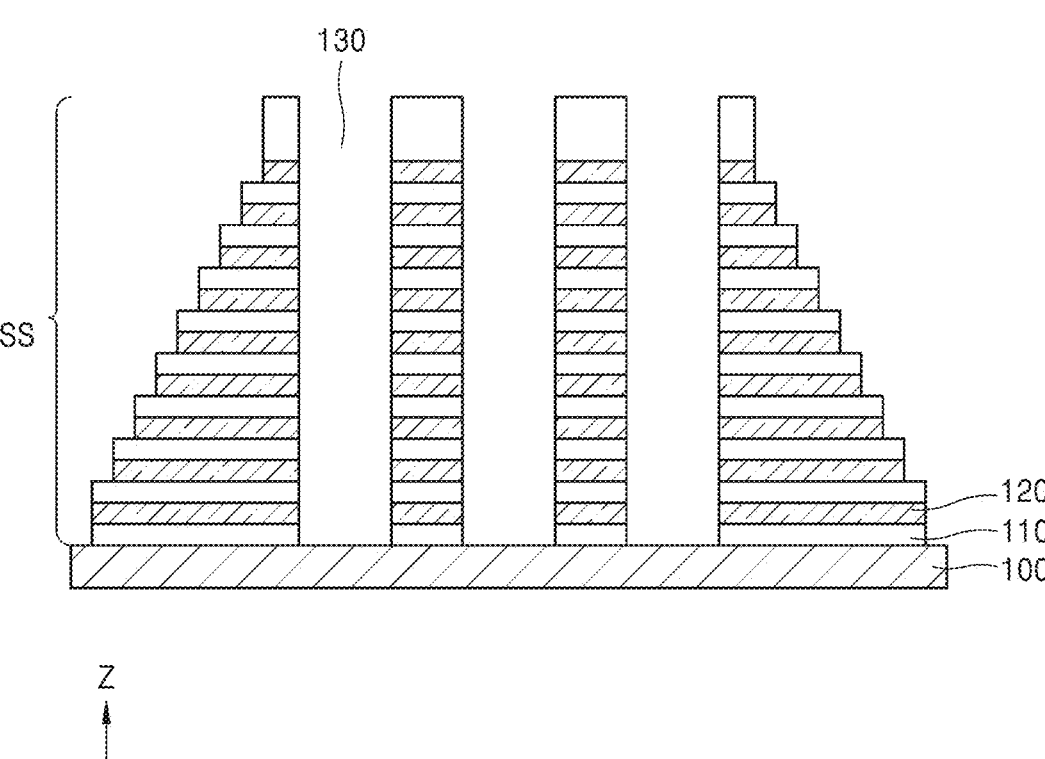
Figure 1D:
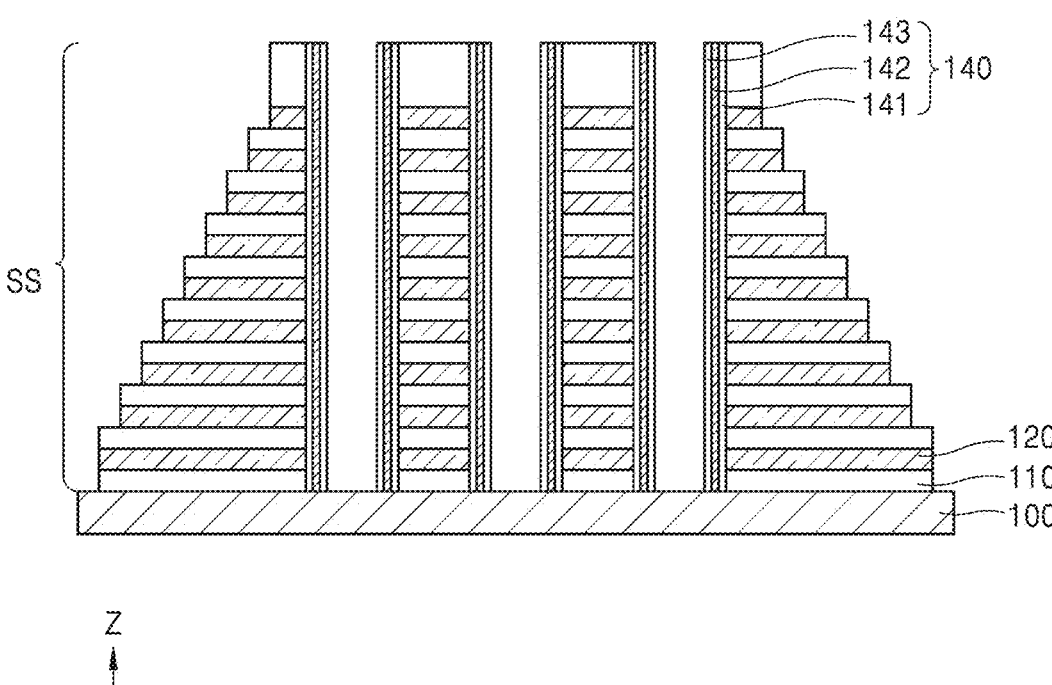
Figure 1E:
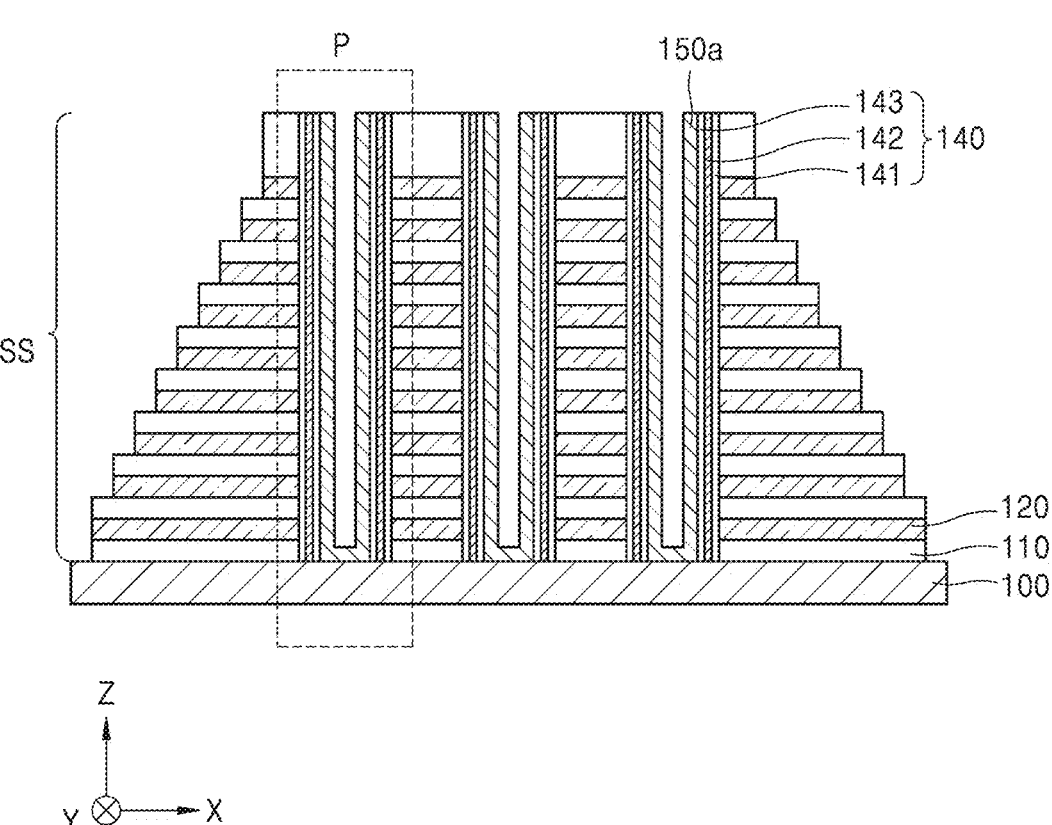
Figure 1F:
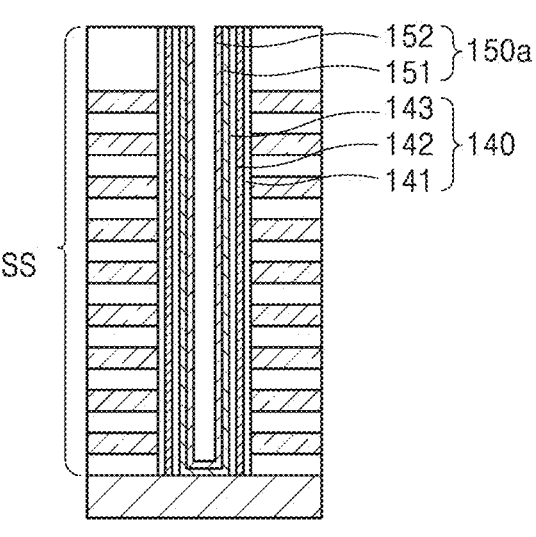
Figure 1F:
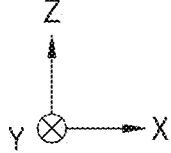
Figure 1G:
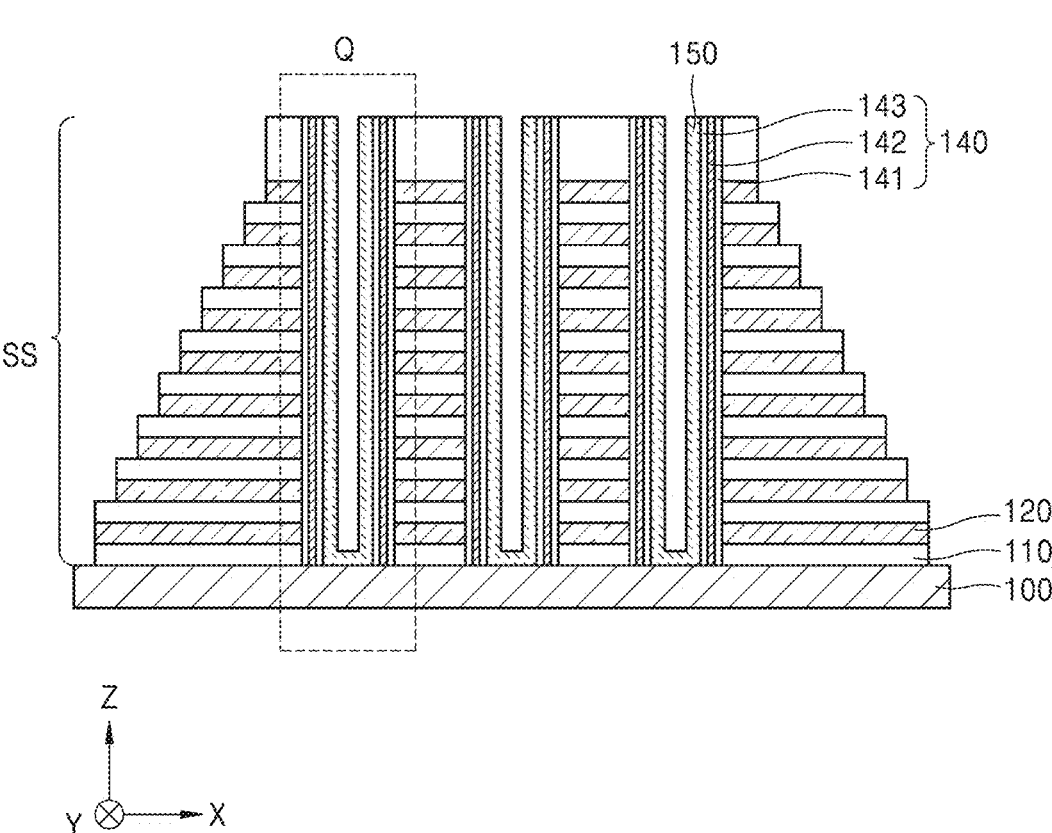
Figure 1H:
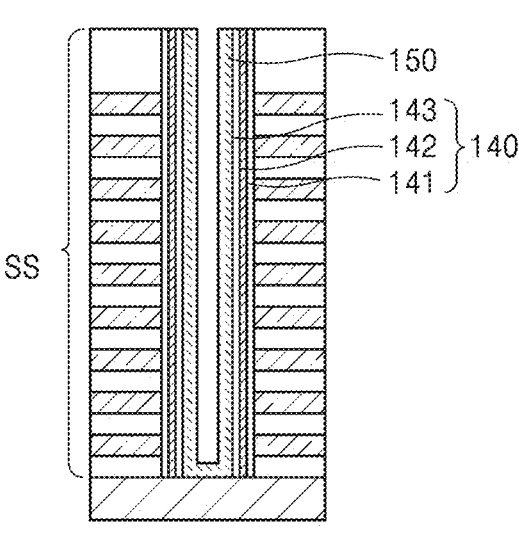
Figure 1H:
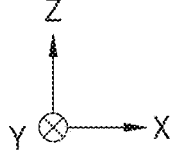
Figure 1I:
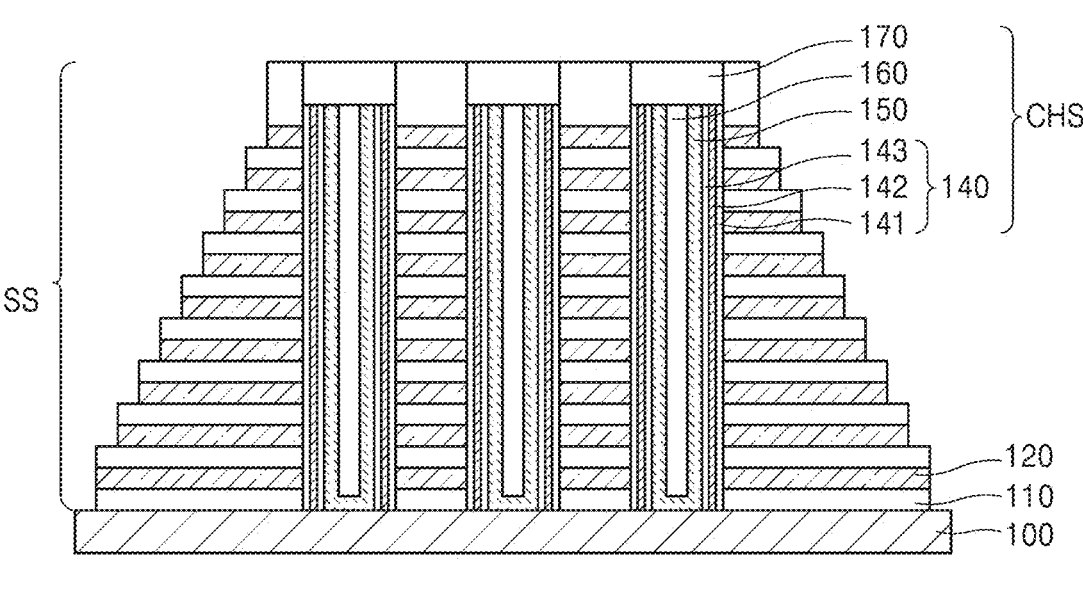
Figure 1I:
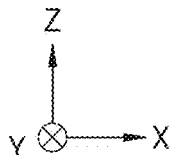
Figure 1J:
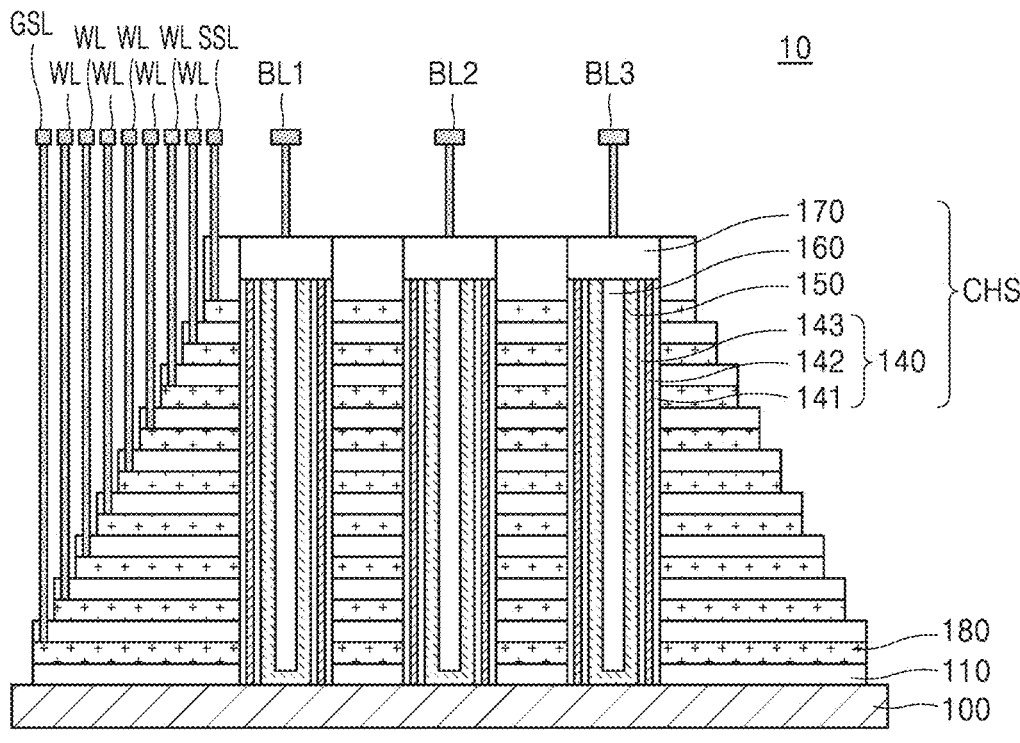
Figure 1J:
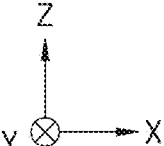

FIGS. 1A to 1J are cross-sectional views illustrating a method of manufacturing a semiconductor device 10 according to example embodiments. FIG. 1F is an enlarged view of a region P of FIG. 1E. FIG. 1H is an enlarged view of a region Q of FIG. 1G. FIG. 1J is a cross-sectional view of a semiconductor device 10 according to example embodiments.

Referring to FIG. 1A, a stacked structure SS in which a plurality of interlayer insulating layers 110 and a plurality of sacrificial layers 120 are alternately stacked may be formed on a substrate 100. The lowermost interlayer insulating layer 110 may be arranged at a lower end of the stacked structure SS to be formed on the substrate 100. The uppermost interlayer insulating layer 110 may be arranged at an upper end of the stacked structure SS.

On the substrate 100, the stacked structure SS may extend in a first horizontal direction (an X direction) parallel to a top surface of the substrate 100 and a second horizontal direction (a Y direction) orthogonal to the first horizontal direction (the X direction). The plurality of interlayer insulating layers 110 and the plurality of sacrificial layers 120 may be alternately stacked in a vertical direction (a Z direction) perpendicular to the top surface of the substrate 100.

The substrate 100 may include a semiconductor material such as a group IV semiconductor material, a group III-V semiconductor material, or a group II-VI semiconductor material. The group IV semiconductor material may include, for example, silicon (Si), germanium (Ge), or silicon-germanium (Si—Ge). The group III-V semiconductor material may include, for example, gallium arsenide (GaAs), indium phosphorus (InP), gallium phosphorus (GaP), indium arsenide (InAs), indium antimony (InSb), or indium gallium arsenide (InGaAs). The group II-VI semiconductor material may include, for example, zinc telluride (ZnTe) or cadmium sulfide (CdS). In some example embodiments, the substrate 100 may include a bulk wafer or an epitaxial layer. In other example embodiments, the substrate 100 may include a silicon-on-insulator (SOI) substrate or a germanium-on-insulator (GeOI) substrate.

The plurality of interlayer insulating layers 110 may include an insulating material that may include silicon oxide, silicon nitride, a low-k dielectric material, or a combination thereof. The low-k dielectric material having a dielectric constant lower than that of silicon oxide may include, for example, phosphosilicate glass (PSG), borophosphosilicate glass (BPSG), fluorosilicate glass (FSG), organosilicate glass (OSG), spin-on-glass (SOG), spin-on-polymer, or a combination thereof.

The plurality of sacrificial layers 120 may be apart from one another by the plurality of interlayer insulating layers 110. The plurality of sacrificial layers 120 may include a material having etching selectivity with respect to the plurality of interlayer insulating layers 110. For example, when the plurality of interlayer insulating layers 110 include silicon oxide, the plurality of sacrificial layers 120 may include silicon nitride.

Referring to FIG. 1B, the plurality of interlayer insulating layers 110 and the plurality of sacrificial layers 120 may be patterned to be stepped. For example, the plurality of interlayer insulating layers 110 may extend in different lengths in the first horizontal direction (the X direction) to be stepped. In addition, in some example embodiments, the plurality of sacrificial layers 120 may extend in different lengths in the first horizontal direction (the X direction) to be stepped. That is, a plane area of an interlayer insulating layer higher in the Z direction is less than that of an interlayer insulating layer lower in the Z direction, and a plane area of a sacrificial layer higher in the Z direction is less than that of a sacrificial layer lower in the Z direction. In the current specification, a plane area means an area on an X-Y plane. In FIG. 1B, the plurality of interlayer insulating layers 110 and the plurality of sacrificial layers 120 may be described as being stepped to go down in a −Z direction.

Referring to FIG. 1C, a photoresist layer (not shown) may be formed on the uppermost interlayer insulating layer 110. The photoresist layer may be formed so that parts of the uppermost interlayer insulating layer 110, which correspond to parts of the substrate 100, in which openings 130 will be formed, are exposed. By etching the plurality of interlayer insulating layers 110 and the plurality of sacrificial layers 120 by using the photoresist layer as a mask, the openings 130 passing through the plurality of interlayer insulating layers 110 and the plurality of sacrificial layers 120 in the vertical direction (the Z direction) may be formed. Bottom surfaces of the openings 130 may expose the parts of the substrate 100. After the openings 130 are formed, the photoresist layer may be removed.

Referring to FIG. 1D, gate insulating layers 140 may be formed on side surfaces of the openings 130. The gate insulating layers 140 may be conformally formed along the side and bottom surfaces (not shown) of the openings 130. Parts of the gate insulating layers 140 on the bottom surfaces of the openings 130 may be removed through an anisotropic etching process. For example, the gate insulating layers 140 arranged on the bottom surfaces of the openings 130 may be etched to expose the parts of the substrate 100.

The gate insulating layers 140 may include blocking insulating layers 141, charge storage layers 142, and tunneling insulating layers 143 sequentially stacked on the side surfaces of the openings 130. Thicknesses of the blocking insulating layers 141, the charge storage layers 142, and the tunneling insulating layers 143 stacked to form the gate insulating layers 140 are not limited to those illustrated in FIGS. 1D to 1J and may vary.

The blocking insulating layers 141 may include, for example, silicon oxide, silicon nitride, metal oxide with permittivity higher than that of silicon oxide, or a combination thereof. The metal oxide may include, for example, hafnium oxide, aluminum oxide, zirconium oxide, tantalum oxide, or a combination thereof. The charge storage layers 142 may include, for example, silicon nitride, boron nitride, polysilicon, or a combination thereof. The tunneling insulating layers 143 may include, for example, metal oxide or silicon oxide. In some example embodiments, the blocking insulating layers 141, the charge storage layers 142, and the tunneling insulating layers 143 may include oxide, nitride, and oxide, respectively.

Referring to FIGS. 1E to 1H, channel layers 150 may be formed on the exposed parts of the substrate 100 and the side surfaces of the openings 130. The forming of the channel layers 150 may include forming amorphous silicon layers 150a on the parts of the substrate 100 and the side surfaces of the openings 130, and crystallizing the amorphous silicon layers 150a to form polycrystalline silicon layers. The channel layers 150 may include the polycrystalline silicon layers.

Referring to FIGS. 1E and 1F, the amorphous silicon layers 150a may be formed on the parts of the substrate 100 and the side surfaces of the openings 130. In some example embodiments, the amorphous silicon layers 150a may be formed along the parts of the substrate 100 and the side surfaces of the gate insulating layers 140. The amorphous silicon layers 150a may include first amorphous silicon layers 151 and second amorphous silicon layers 152.

The first amorphous silicon layers 151 may be formed on the parts of the substrate 100 and the side surfaces of the openings 130. In some example embodiments, the first amorphous silicon layers 151 may be formed between the second amorphous silicon layers 152 and the gate insulating layers 140. In some example embodiments, the first amorphous silicon layers 151 may contact the gate insulating layers 140 and the parts of the substrate 100. The second amorphous silicon layers 152 may be formed on the first amorphous silicon layers 151. In some example embodiments, the second amorphous silicon layers 152 may be formed on the first amorphous silicon layers 151.

The forming of the amorphous silicon layers 150a may include forming the first amorphous silicon layers 151 on the parts of the substrate 100 and the side surfaces of the openings 130, and forming the second amorphous silicon layers 152 on the first amorphous silicon layers 151 after the forming of the first amorphous silicon layers 151. During the forming of the first amorphous silicon layers 151, a silicon source gas and an impurity source gas are supplied together, and the forming of the first amorphous silicon layers 151 may be performed at a first temperature. During the forming of the second amorphous silicon layers 152, the silicon source gas may be supplied and the impurity source gas may not be supplied. The forming of the second amorphous silicon layers 152 may be performed at a second temperature higher than the first temperature.

In some example embodiments, the silicon source gas may include at least one selected from $SiH_4$, $Si_2H_6$, $Si_3H_8$, and $SiH_2Cl_2$. However, the inventive concepts are not limited thereto.

In some example embodiments, the first amorphous silicon layers 151 may include impurities, and the impurities may include at least one selected from oxygen (O), carbon ©, and nitrogen (N). However, the inventive concepts are not limited thereto.

In some example embodiments, the impurity source gas may include at least one selected from $N_2O$, $C_2H_4$, and $NH_3$. However, the inventive concepts are not limited thereto.

In the forming of the first amorphous silicon layers 151, by supplying the silicon source gas and the impurity source gas together, the impurities may suppress nucleation at an interface between each of the first amorphous silicon layers 151 and the substrate 100. Accordingly, a size of each of crystal grains in the channel layers 150 may increase. When the size of each of the crystal grains increases, a current lost through a grain boundary is reduced so that mobility of a channel and a cell current may increase.

In some example embodiments, the first temperature at which the first amorphous silicon layers 151 are formed is lower than the second temperature at which the second amorphous silicon layers 152 are formed. Accordingly, although the silicon source gas and the impurity source gas are supplied together during the forming of the first amorphous silicon layers 151, a level of impurities at the interface between each of the first amorphous silicon layers 151 and the substrate 100 may be maintained not too high. In addition, when a temperature at the interface between each of the first amorphous silicon layers 151 and the substrate 100 is lower, nucleation is suppressed and the size of each of the crystal grains may increase later.

In some example embodiments, the second temperature is higher than the first temperature. That is, the temperature (the second temperature) at which the silicon source gas is supplied and the impurity source gas is not supplied is higher than the temperature (the first temperature) at which the silicon source gas and the impurity source gas are supplied together. Accordingly, an overall reaction rate for forming the amorphous silicon layers 150a may be maintained at a certain level (for example, predetermined or desired) or higher.

In some example embodiments, the first temperature may be about 350° C. to about 380° C., and the second temperature may be about 450° C. to about 500° C. However, the inventive concepts are not limited thereto. The first temperature may be 350° C. or higher so that the overall reaction rate for forming the amorphous silicon layers 150a may be maintained at a certain level (for example, predetermined or desired) or higher. The first temperature may be 380° C. or lower so that it is possible to reduce or prevent crystalline silicon having a smaller grain size from being deposited. The second temperature may be about 450° C. to about 500° C. so that the overall reaction rate for forming the amorphous silicon layers 150a may be maintained at a certain level (for example, predetermined or desired) or higher.

Referring to FIGS. 1G and 1H, the polycrystalline silicon layers may be formed by crystallizing the amorphous silicon layers 150a (refer to FIGS. 1E and 1F) so that the channel layers 150 may be formed.

The forming of the polycrystalline silicon layers by crystallizing the amorphous silicon layers 150a (refer to FIGS. 1E and 1F) may be performed at a temperature of about 600° C. to about 700° C. for about 6 hours to about 12 hours.

It is illustrated that the first amorphous silicon layers 151, the second amorphous silicon layers 152, the amorphous silicon layers 150a, and the channel layers 150 are cup-shaped, which is only exemplary. For example, the first amorphous silicon layers 151, the second amorphous silicon layers 152, the amorphous silicon layers 150a, and the channel layers 150 may be cylindrical or square columnar to extend in the vertical direction (the Z direction).

In some example embodiments, the channel layers 150 may include impurities, and the impurities may include at least one selected from O, C, and N. A concentration of the impurities in the channel layers 150 may be about 0.2 atom % to about 0.5 atom %. However, the inventive concepts are not limited thereto. The concentration of the impurities in the channel layers 150 may be about 0.2 atom % or more so that nucleation may be suppressed and the size of each of the crystal grains may increase later. The concentration of the impurities in the channel layers 150 may be about 0.5 atom % or less so that the cell current may increase.

Referring to FIG. 1I, filling insulating layers 160 may be formed on the channel layers 150. The filling insulating layers 160 may include, for example, an insulating material that may include silicon nitride, silicon oxide, a low-k dielectric material, or a combination thereof. In some example embodiments, the filling insulating layers 160 may include silicon oxide. For example, the filling insulating layers 160 may fill spaces limited by the channel layers 150 in the openings 130. Unlike in FIG. 1I, in other example embodiments, the filling insulating layers 160 may be omitted, and the channel layers 150 may be columnar to fill remaining parts of the openings 130.

Next, channel pads 170 may be formed. The channel pads 170 may contact the channel layers 150 and the filling insulating layers 160 and may fill upper ends of the openings 130. The channel pads 170 may include a semiconductor material such as Si, Ge, or Si—Ge; a metal material such as tungsten (W), titanium (Ti), aluminum (Al), copper (Cu), gold (Au), or silver (Ag); metal nitride such as titanium nitride (TiN) or tantalum nitride (TaN), or a conductive material such as a combination thereof. In some example embodiments, the channel pads 170 may include polysilicon.

Accordingly, a channel structure CHS including the gate insulating layers 140, the channel layers 150, the filling insulating layers 160, and/or the channel pads 170 may be manufactured.

The channel structure CHS may be located in the openings 130 passing through the plurality of interlayer insulating layers 110 and the plurality of sacrificial layers 120 in the vertical direction (the Z direction). The channel structure CHS may extend in the vertical direction (the Z direction) to intersect the top surface of the substrate 100 and may pass through the stacked structure SS.

Referring to FIG. 1J, the plurality of sacrificial layers 120 may be replaced by a plurality of gate layers 180.

The plurality of gate layers 180 may be apart from one another by the plurality of interlayer insulating layers 110. The plurality of gate layers 180 may include W, Cu, Ag, Au, Al, or a combination thereof. However, the inventive concepts are not limited thereto. In some example embodiments, the plurality of gate layers 180 may include Ti, Ta, TiN, TaN, or a combination thereof to reduce or prevent the conductive material from diffusing into the plurality of interlayer insulating layers 110 and may further include a barrier material that is not limited thereto.

Figure 3:
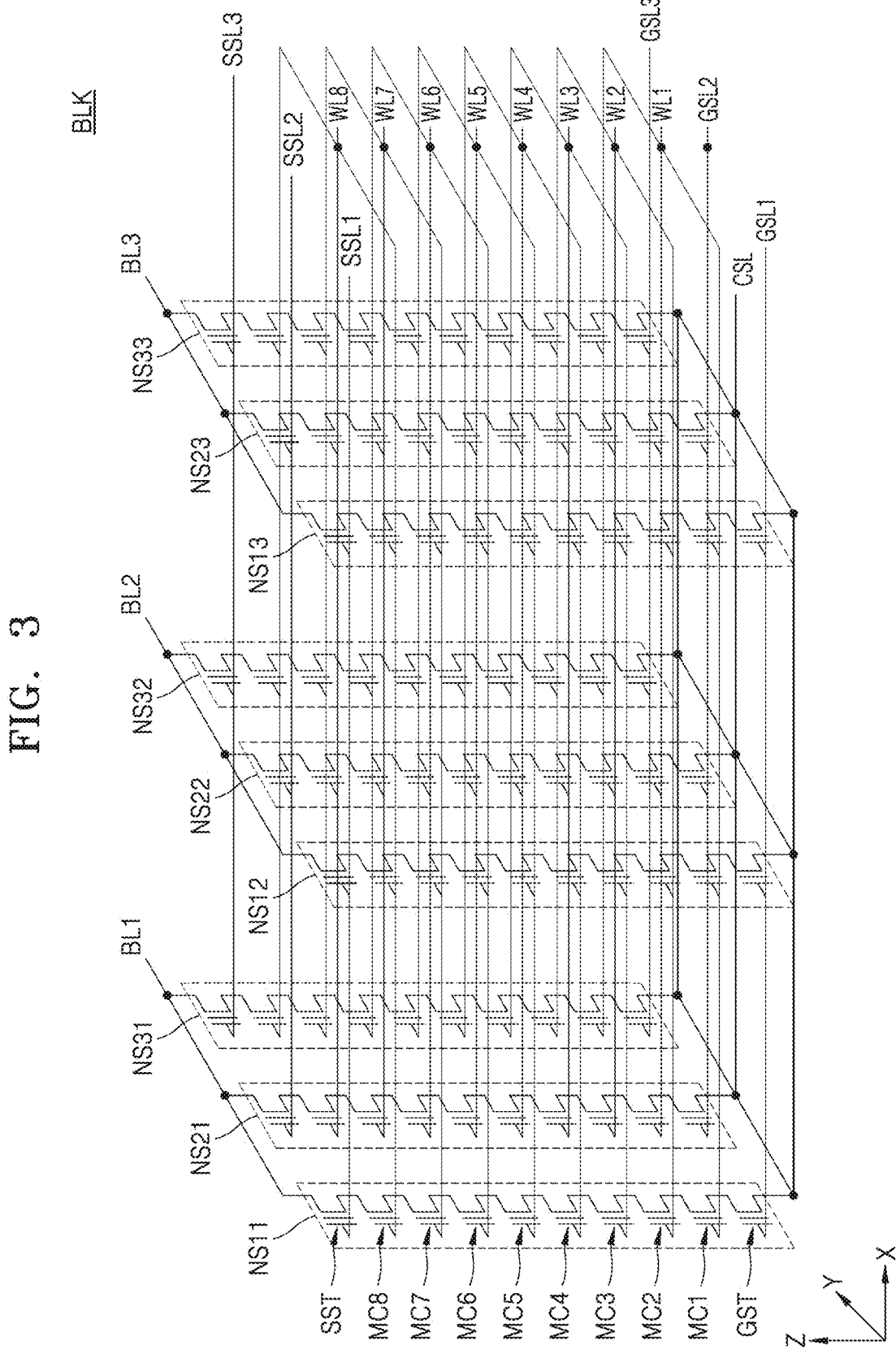
FIG. 3 is a schematic circuit diagram of a block included in a semiconductor device according to example embodiments.

The channel structure CHS and the plurality of gate layers 180 may form one of a plurality of NAND strings NS11 to NS33 illustrated in FIG. 3. For example, the lowermost gate layer and the channel structure CHS may form a ground selection transistor GST illustrated in FIG. 3, remaining gate layers excluding the lowermost gate layer and the uppermost gate layer and the channel structure CHS may form first to eighth memory cells MC1 to MC8 illustrated in FIG. 3, and the uppermost gate layer and the channel structure CHS may form a string selection transistor SST illustrated in FIG. 3.

A ground selection line GSL, a plurality of word lines WL, and a string selection line SSL connected to the plurality of gate layers 180 may be formed. A plurality of bit lines BL1 to BL3 connected to upper ends of a plurality of channel structures CHS, respectively, may be formed.

Figure 2:
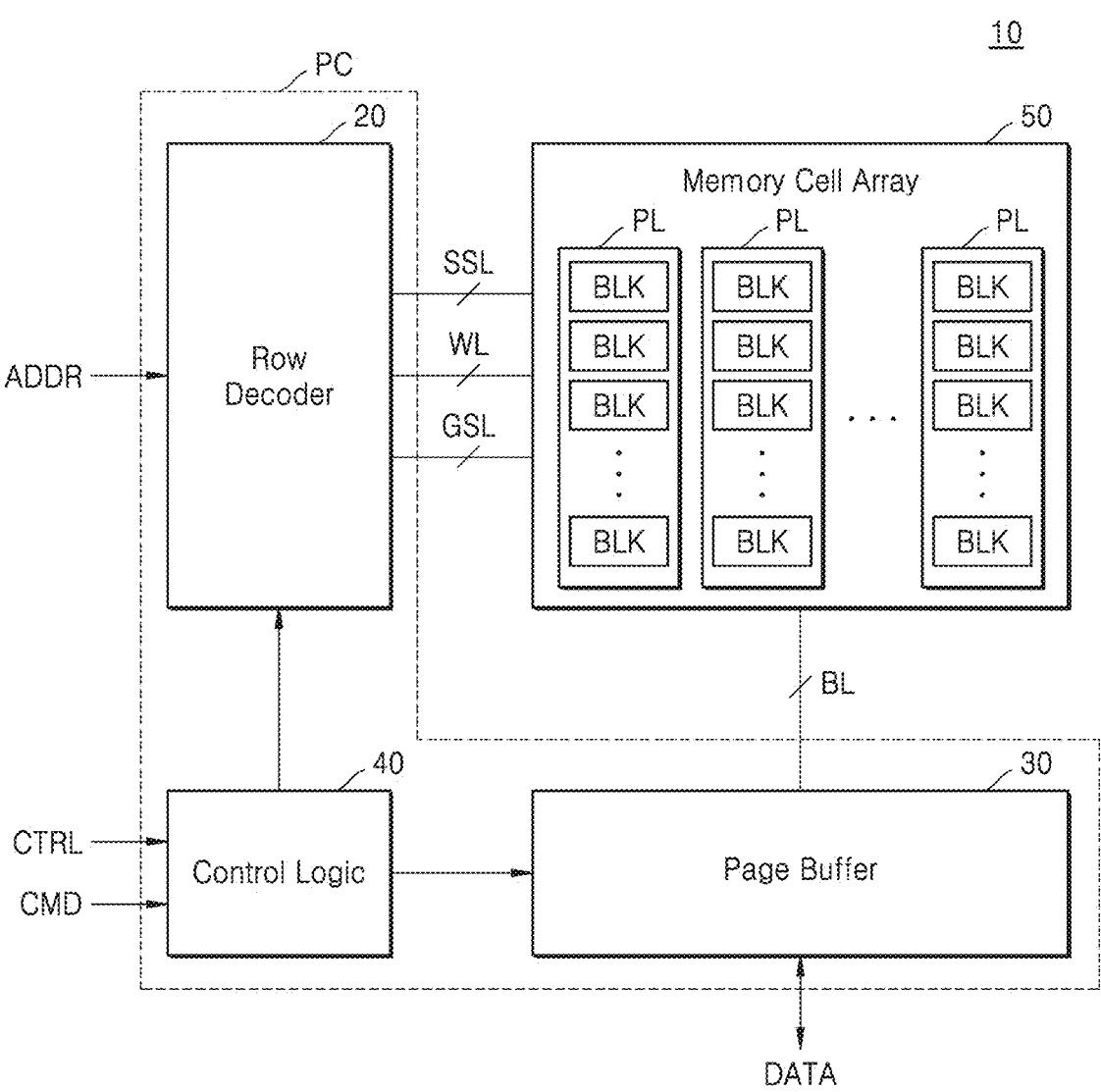
FIG. 2 is a block diagram of a semiconductor device according to example embodiments.

The ground selection line GSL, the plurality of word lines WL, the string selection line SSL, and the plurality of bit lines BL1 to BL3 may connect planes PL (refer to FIG. 2) to a peripheral circuit PC (refer to FIG. 2). The ground selection line GSL, the plurality of word lines WL, the string selection line SSL, and the plurality of bit lines BL1 to BL3 may include a conductive material such as Cu, Al, W, Ag, or Au. However, the inventive concepts are not limited thereto. In some example embodiments, the ground selection line GSL, the plurality of word lines WL, the string selection line SSL, and the plurality of bit lines BL1 to BL3 may further include a barrier material such as Ti, Ta, TiN, or TaN. However, the inventive concepts are not limited thereto.

The semiconductor device 10 may be manufactured by the method described with reference to FIGS. 1A to 1J.

FIG. 2 is a block diagram of the semiconductor device 10 according to example embodiments.

Referring to FIG. 2, the semiconductor device 10 may maintain stored data even when power supply is cut off. For example, the semiconductor device 10 may include electrically erasable programmable read-only memory (EEPROM), flash memory, phase change random access memory (PRAM), resistive random access memory (RRAM), magnetic random access memory (MRAM), ferroelectric random access memory (FRAM), or a combination thereof. Hereinafter, example embodiments will be described in detail assuming that the semiconductor device 10 is 3D NAND flash memory.

The semiconductor device 10 may include a memory cell array 50 and/or a peripheral circuit PC. The memory cell array 50 may include a plurality of planes PL. Each of the plurality of planes PL may be, for example, a minimum unit in which an operation such as a read, write, or delete operation is independently performed. When the memory cell array 50 includes the plurality of planes PL, a plurality of operations may be simultaneously performed by the plurality of planes PL, respectively. Each of the plurality of planes PL may include a plurality of blocks BLK. Each of the plurality of blocks BLK may be a minimum unit of the delete operation. Each of the plurality of blocks BLK may include a plurality of pages. Each of the plurality of pages may be a minimum unit of the read and write operations. Each of the plurality of pages may include a plurality of memory cells capable of storing data.

The peripheral circuit PC may include a row decoder 20, a page buffer 30, and/or a control logic 40. The row decoder 20 may be connected to the memory cell array 50 by a plurality of string selection lines SSL, a plurality of word lines WL, and a plurality of ground selection lines GSL. The row decoder 20 may select at least one of the plurality of blocks BLK of the memory cell array 50 in response to an address ADDR provided by a memory controller (not shown). In addition, the row decoder 20 may select at least one of word lines WL, string selection lines SSL, and ground selection lines GSL of a block BLK selected in response to the address ADDR provided by the memory controller (not shown).

The page buffer 30 may be connected to the memory cell array 50 through a plurality of bit lines BL. The page buffer 30 may select at least one of the plurality of bit lines BL. The page buffer 30 may store data DATA received from the memory controller (not shown) in the memory cell array 50. In addition, the page buffer 30 may output the data DATA read from the memory cell array 50 to the memory controller (not shown).

The control logic 40 may control an overall operation of the semiconductor device 10. For example, the control logic 40 may control operations of the row decoder 20 and the page buffer 30. For example, the semiconductor device 10 may be controlled to perform a memory operation corresponding to a command CMD provided by the memory controller (not shown). In addition, the control logic 40 may generate various internal control signals used by the semiconductor device 10 in response to a control signal CTRL provided by the memory controller (not shown).

FIG. 3 is a schematic circuit diagram of a block BLK included in a semiconductor device according to example embodiments.

Referring to FIG. 3, the block BLK may include the plurality of NAND strings NS11 to NS33. Although it is illustrated in FIG. 3 that one block BLK includes nine NAND strings NS11 to NS33, the number of NAND strings included in one block BLK is not limited thereto. Each of the plurality of NAND strings NS11 to NS33 may extend in the vertical direction (the Z direction). Each of the plurality of NAND strings NS11 to NS33 may include at least one string selection transistor SST connected in series, the first to eighth memory cells MC1 to MC8, and at least one ground selection transistor GST. Although it is illustrated in FIG. 3 that each of the plurality of NAND strings NS11 to NS33 includes one string selection transistor SST, eight memory cells MC1 to MC8, and one ground selection transistor GST, the number of string selection transistors, memory cells, and ground selection transistors included in each of the plurality of NAND strings NS11 to NS33 is not limited thereto.

In some example embodiments, each of the plurality of NAND strings NS11 to NS33 may further include a dummy memory cell (not shown) between at least one ground selection transistor GST and the first memory cell MC1. In some example embodiments, each of the plurality of NAND strings NS11 to NS33 may further include a dummy memory cell (not shown) between the eighth memory cell MC8 and at least one string selection transistor SST.

The plurality of NAND strings NS11 to NS33 may be connected between the plurality of bit lines BL1 to BL3 and a common source line CSL. Each of the plurality of bit lines BL1 to BL3 may extend in the second horizontal direction (the Y direction). Gates of string selection transistors SST may be connected to string selection lines SSL1 to SSL3, gates of the memory cells MC1 to MC8 may be connected to word lines WL1 to WL8, and gates of ground selection transistors GST may be connected to ground selection lines GSL1 to GSL3. Each of the string selection lines SSL1 to SSL3, each of the word lines WL1 to WL8, and each of the ground selection lines GSL1 to GSL3 may extend in the first horizontal direction (the X direction). The common source line CSL may be commonly connected to the plurality of NAND strings NS11 to NS33. In addition, the word lines WL1 to WL8 may be commonly connected to the plurality of NAND strings NS11 to NS33.

Each of the memory cells MC1 to MC8 may store one bit of data or two or more bits of data. A memory cell capable of storing one bit of data is referred to as a single-level cell (SLC) or a single-bit cell. A memory cell capable of storing two or more bits of data is referred to as a multi-level cell (MLC) or a multi-bit cell.

Figure 4:
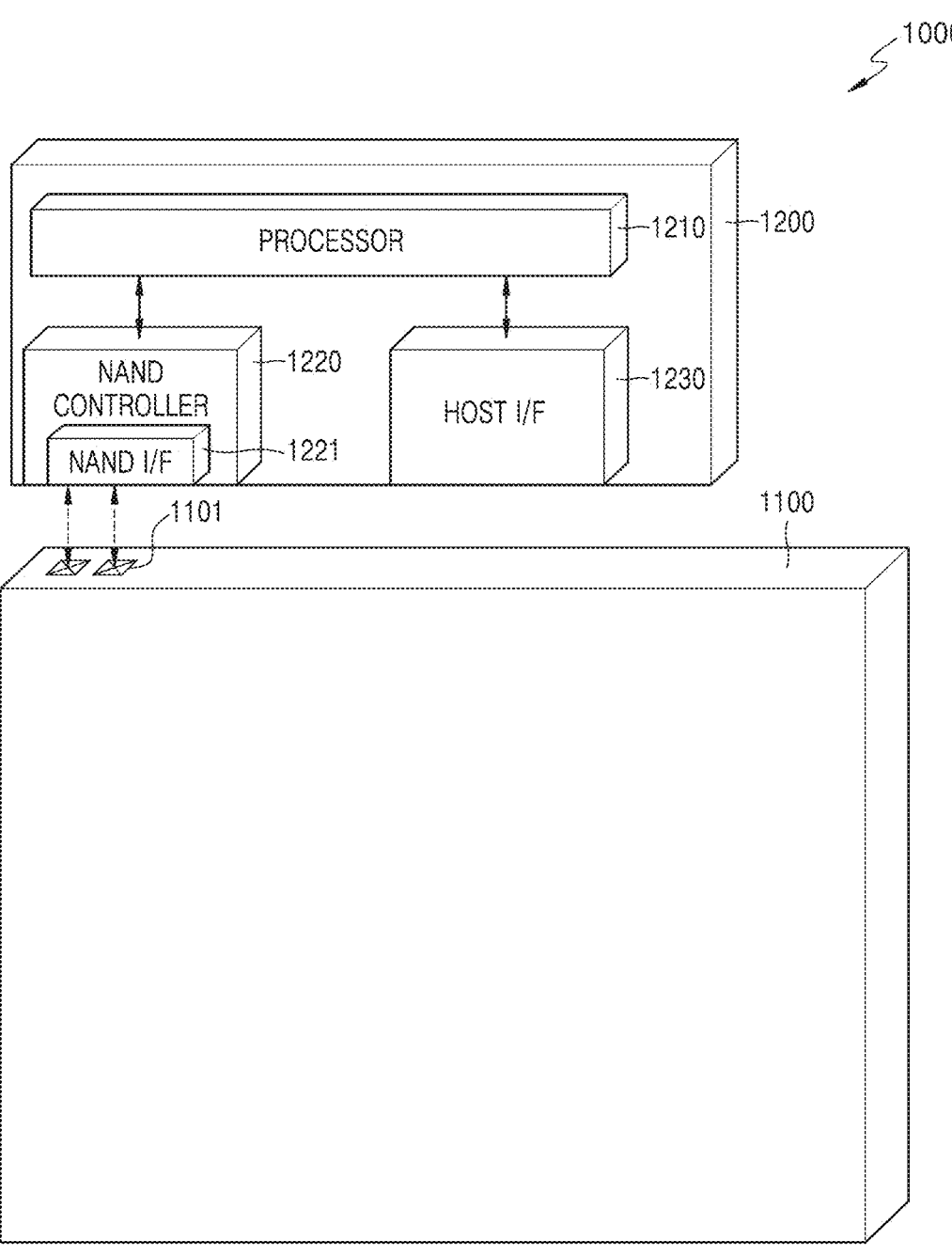
FIG. 4 is a schematic diagram of an electronic system including a semiconductor device according to example embodiments.

FIG. 4 is a schematic diagram of an electronic system 1000 including a semiconductor device 1100 according to example embodiments.

Referring to FIG. 4, the electronic system 1000 according to example embodiments may include the semiconductor device 1100 and/or a controller 1200 connected to the semiconductor device 1100. The electronic system 1000 may include a storage device including one or a plurality of semiconductor devices 1100 or an electronic device including the storage device. For example, the electronic system 1000 may include a solid state drive (SSD) device, a universal serial bus (USB), a computing system, a medical device, or a communication device including at least one semiconductor device 1100.

The semiconductor device 1100 may include the semiconductor device 10 of FIGS. 1J and 2. The semiconductor device 1100 may communicate with the controller 1200 through input and output pads 1101 electrically connected to the control logic 40 (refer to FIG. 2).

The controller 1200 may include a processor 1210, a NAND controller 1220, and/or a host interface 1230. According to example embodiments, the electronic system 1000 may include a plurality of semiconductor devices 1100, and in some example embodiments, the controller 1200 may control the plurality of semiconductor devices 1100.

The processor 1210 may control an overall operation of the electronic system 1000 including the controller 1200. The processor 1210 may operate in accordance with prede-termined or alternatively, desired firmware and may control the NAND controller 1220 to access the semiconductor device 1100. The NAND controller 1220 may include a NAND interface 1221 processing communications with the semiconductor device 1100. A control command for con-trolling the semiconductor device 1100, data to be recorded in the semiconductor device 1100, and data to be read from the semiconductor device 1100 may be transmitted through the NAND interface 1221. The host interface 1230 may provide a communication function between the electronic system 1000 and an external host. When the control com-mand is received from the external host through the host interface 1230, the processor 1210 may control the semi-conductor device 1100 in response to the control command.

Figure 5:
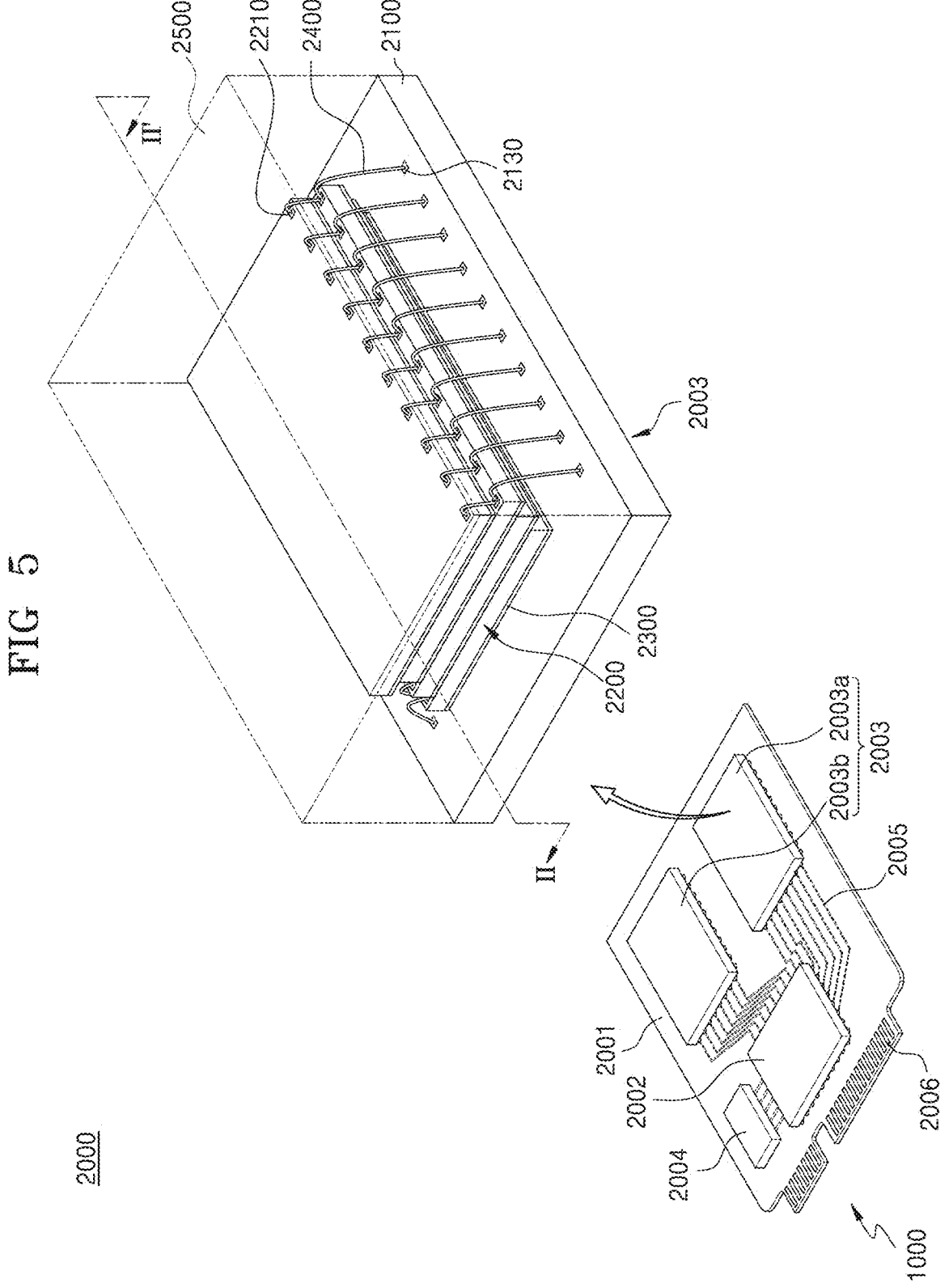
FIG. 5 is a schematic diagram of an electronic system including a semiconductor device according to example embodiments.

FIG. 5 is a schematic diagram of an electronic system 2000 including a semiconductor device according to example embodiments.

Referring to FIG. 5, the electronic system 2000 may include a main substrate 2001, a controller 2002 on the main substrate 2001, one or more semiconductor packages 2003, and/or dynamic random access memory (DRAM) 2004. The semiconductor package 2003 and the DRAM 2004 may be connected to the controller 2002 by a plurality of wiring patterns 2005 formed on the main substrate 2001.

The main substrate 2001 may include a connector 2006 including a plurality of pins coupled with the external host. The number and arrangement of pins in the connector 2006 may vary depending on a communication interface between the electronic system 2000 and the external host. In some example embodiments, the electronic system 2000 may communicate with the external host in accordance with one of interfaces such as a universal serial bus (USB), peripheral component interconnect express (PCI-Express), serial advanced technology attachment (SATA), and M-Phy for universal flash storage (UFS). In some example embodi-ments, the electronic system 2000 may operate by power supplied by the external host through the connector 2006. The electronic system 2000 may further include a power management integrated circuit (PMIC) distributing power received from the external host to the controller 2002 and the semiconductor package 2003.

The controller 2002 may record or read data in or from the semiconductor package 2003, and may increase an operating speed of the electronic system 2000.

The DRAM 2004 may include buffer memory for reduc-ing a speed difference between the semiconductor package 2003 as a data storage space and the external host. The DRAM 2004 included in the electronic system 2000 may also operate as a kind of cache memory, and may provide a space for temporarily storing data in a control operation for the semiconductor package 2003. When the DRAM 2004 is included in the electronic system 2000, the controller 2002 may further include a DRAM controller for controlling the DRAM 2004 in addition to the NAND controller for con-trolling the semiconductor package 2003.

The semiconductor package 2003 may include first and second semiconductor packages 2003a and 2003b apart from each other. Each of the first and second semiconductor packages 2003a and 2003b may include a plurality of semiconductor chips 2200. Each of the first and second semiconductor packages 2003a and 2003b may include a package substrate 2100, a plurality of semiconductor chips 2200 on the package substrate 2100, an adhesive layer 2300 on a bottom surface of each of the plurality of semiconductor chips 2200, a connection structure 2400 electrically con-necting the plurality of semiconductor chips 2200 to the package substrate 2100, and a molding layer 2500 covering the plurality of semiconductor chips 2200 and the connec-tion structure 2400 on the package substrate 2100.

The package substrate 2100 may include a printed circuit board (PCB) including a plurality of package upper pads 2130. Each of the plurality of semiconductor chips 2200 may include input and output pads 2210. The input and output pads 2210 may correspond to the input and output pads 1101 of FIG. 4.

Each of the plurality of semiconductor chips 2200 may include the semiconductor device 10 illustrated in FIGS. 1J and 2.

In some example embodiments, the connection structure 2400 may include a bonding wire electrically connecting the input and output pads 2210 to the plurality of package upper pads 2130. Accordingly, in the first and second semicon-ductor packages 2003a and 2003b, the plurality of semicon-ductor chips 2200 may be electrically connected to one another by a bonding wire method, and may be connected to the plurality of package upper pads 2130 of the package substrate 2100. According to some example embodiments, in the first and second semiconductor packages 2003*a* and 2003*b*, the plurality of semiconductor chips 2200 may be electrically connected to one another by a connection structure including a through silicon via (TSV) instead of the bonding wire type connection structure 2400.

In some example embodiments, the controller 2002 and the plurality of semiconductor chips 2200 may be included in one package. In some example embodiments, the controller 2002 and the plurality of semiconductor chips 2200 may be mounted on an interposer substrate different from the main substrate 2001, and the controller 2002 may be connected to the plurality of semiconductor chips 2200 by wiring formed on the interposer substrate.

Each of the plurality of semiconductor chips 2200 may include the semiconductor device 10 illustrated in FIGS. 1J and 2.

Figure 6:
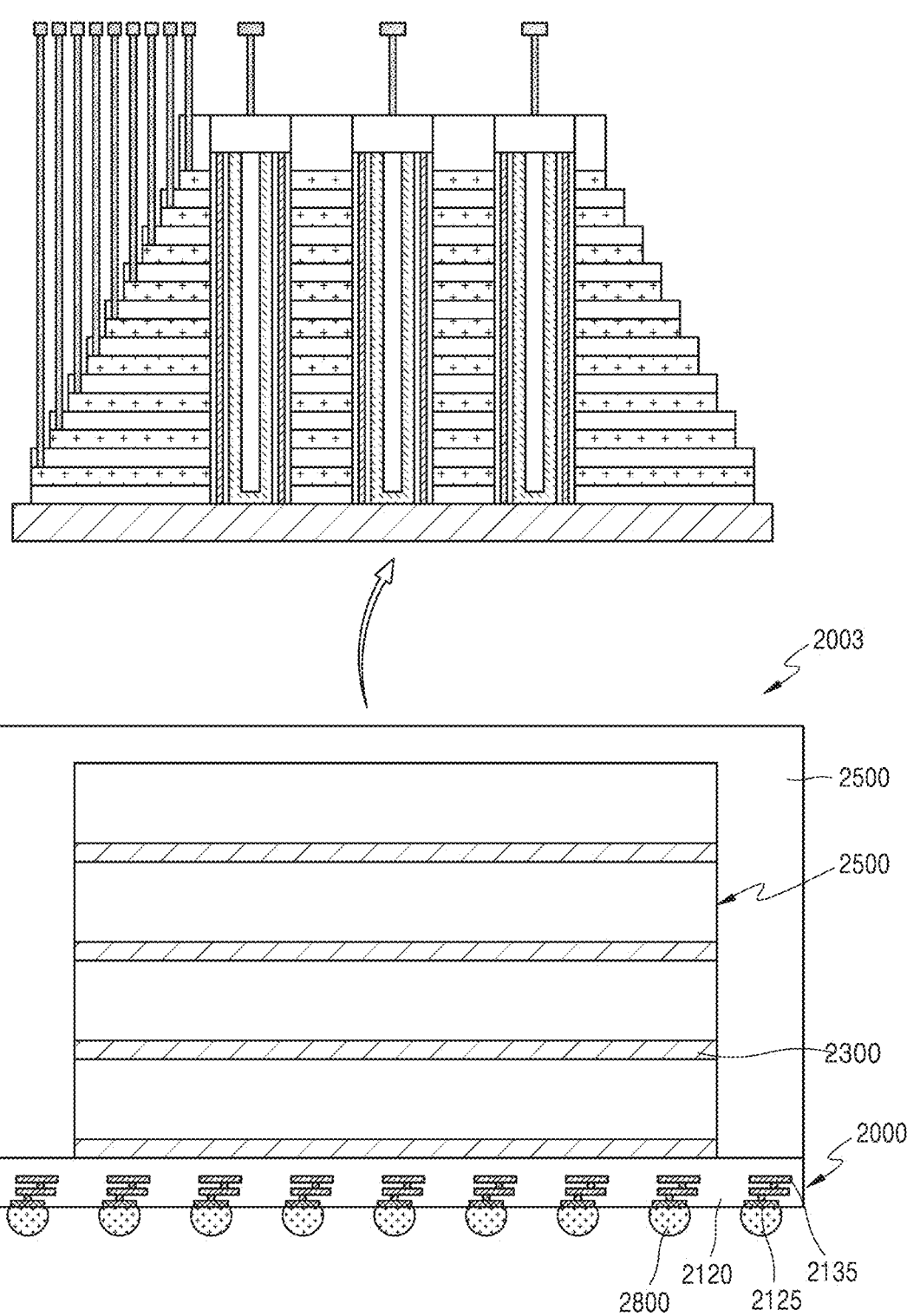
FIG. 6 is a cross-sectional view of a semiconductor package including a semiconductor device according to example embodiments, which is taken along the line II-II' of FIG. 5.

FIG. 6 is a cross-sectional view of the semiconductor package 2003 including a semiconductor device according to example embodiments, which is taken along the line II-II' of FIG. 5.

Referring to FIG. 6, in the semiconductor package 2003, the package substrate 2100 may include a PCB. The package substrate 2100 may include a package substrate body 2120, the plurality of package upper pads 2130 (refer to FIG. 5) arranged on a top surface of the package substrate body 2120, a plurality of lower pads 2125 arranged on or exposed through a bottom surface of the package substrate body 2120, and a plurality of internal wiring lines 2135 electrically connecting the plurality of package upper pads 2130 to the plurality of lower pads 2125 in the package substrate body 2120. The plurality of lower pads 2125 may be connected to the plurality of wiring patterns 2005 on the main substrate 2001 of the electronic system 2000 illustrated in FIG. 5 through a plurality of conductive connections 2800.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

While the inventive concepts have been particularly shown and described with reference to example embodiments thereof, it will be understood that various changes in form and details may be made therein without departing from the spirit and scope of the following claims.

What is claimed is:

1. A method of manufacturing a semiconductor device, the method comprising:
   forming a stacked structure in which a plurality of inter-layer insulating layers and a plurality of sacrificial layers are alternately stacked on a substrate;
   etching the stacked structure to form an opening exposing a part of the substrate through the stacked structure;

forming a channel layer on the part of the substrate and a side surface of the opening; and
   replacing the plurality of sacrificial layers by a plurality of gate layers, wherein the forming of the channel layer comprises:
      forming, in the opening, a first amorphous silicon layer at a first temperature on both the part of the substrate and the side surface of the opening by supplying a silicon source gas and an impurity source gas together, wherein the first amorphous silicon layer contacts the part of the substrate; and
      forming, in the opening, a second amorphous silicon layer in contact with the first amorphous silicon layer and on the first amorphous silicon layer at a second temperature by supplying the silicon source gas and not supplying the impurity source gas after the forming of the first amorphous silicon layer, and
      wherein the second temperature is higher than the first temperature.

2. The method of claim 1, wherein the first temperature is 350° C. to 380° C. and the second temperature is 450° C. to 500° C.

3. The method of claim 1, wherein the silicon source gas comprises at least one selected from the group consisting of SiH$_4$, Si$_2$H$_6$, Si$_3$H$_8$, and SiH$_2$Cl$_2$.

4. The method of claim 1, wherein the first amorphous silicon layer comprises impurities, and the impurities comprises at least one selected from the group consisting of oxygen (O), carbon (C), and nitrogen (N).

5. The method of claim 1, wherein the impurity source gas comprises at least one selected from the group consisting of N$_2$O, C$_2$H$_4$, and NH$_3$.

6. The method of claim 1, wherein the forming of the channel layer comprises forming a polycrystalline silicon layer by crystallizing the first amorphous silicon layer and the second amorphous silicon layer.

7. The method of claim 6, wherein the forming of the polycrystalline silicon layer is performed at a temperature of 600° C. to 700° C. for 6 hours to 12 hours.

8. The method of claim 1, wherein the channel layer comprises impurities, wherein the impurities comprises at least one selected from the group consisting of O, C, and N, and
   wherein a concentration of the impurities in the channel layer is 0.2 atom % to 0.5 atom %.

9. The method of claim 1, further comprising forming a gate insulating layer on the side surface of the opening, wherein the channel layer is formed on the part of the substrate and the gate insulating layer.

10. The method of claim 1, further comprising patterning the stacked structure so that the stacked structure is stepped.

11. A method of manufacturing a semiconductor device, the method comprising:
   forming a stacked structure in which a plurality of inter-layer insulating layers and a plurality of sacrificial layers are alternately stacked on a substrate;
   etching the stacked structure to form an opening passing through the stacked structure;
   forming, in the opening, a first amorphous channel layer including impurities on a side surface of the opening, wherein the first amorphous channel layer contacts a part of the substrate; and
   forming, in the opening, a second amorphous channel layer in contact with the first amorphous channel layer and on the first amorphous channel layer, wherein a first temperature at which the first amorphous channel layer is formed is lower than a second temperature at which the second amorphous channel layer is formed.

12. The method of claim 11, wherein each of the first amorphous channel layer and the second amorphous channel layer comprises amorphous silicon.

13. The method of claim 11, wherein the forming of the first amorphous channel layer comprises supplying an impurity source gas including the impurities.

14. The method of claim 11, wherein the forming of the second amorphous channel layer does not comprise supplying an impurity source gas including the impurities.

15. The method of claim 11, wherein the second amorphous channel layer does not comprise the impurities.

16. The method of claim 11, wherein the impurities comprises at least one selected from the group consisting of O, C, and N.

17. The method of claim 11, wherein the first temperature is 350° C. to 380° C. and the second temperature is 450° C. to 500° C.

18. The method of claim 11, further comprising forming a polycrystalline channel layer by crystallizing the first amorphous channel layer and the second amorphous channel layer.

19. A method of manufacturing a semiconductor device, the method comprising:

forming a stacked structure in which a plurality of inter-layer insulating layers and a plurality of sacrificial layers are alternately stacked on a substrate;

etching the stacked structure to form an opening exposing a part of the substrate through the stacked structure;

forming a gate insulating layer on a side surface of the opening;

forming, in the opening, a first amorphous silicon layer at a first temperature on both the part of the substrate and the gate insulating layer by supplying a silicon source gas and an impurity source gas together, wherein the first amorphous silicon layer contacts the part of the substrate;

forming, in the opening, a second amorphous silicon layer in contact with the first amorphous silicon layer and on the first amorphous silicon layer at a second temperature higher than the first temperature by supplying the silicon source gas and not supplying the impurity source gas; and forming a polycrystalline silicon layer by crystallizing the first amorphous silicon layer and the second amorphous silicon layer, wherein the first amorphous silicon layer comprises impurities, and the impurities comprises at least one selected from the group consisting of O, C, and N.

* * * * *